(12) United States Patent
Boettiger et al.

(10) Patent No.: US 7,566,405 B2
(45) Date of Patent: Jul. 28, 2009

(54) MICRO-LENSES FOR CMOS IMAGERS AND METHOD FOR MANUFACTURING MICRO-LENSES

(75) Inventors: Ulrich C. Boettiger, Boise, ID (US); Jin Li, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 175 days.

(21) Appl. No.: 11/385,679

(22) Filed: Mar. 22, 2006

(65) Prior Publication Data
US 2006/0175287 A1    Aug. 10, 2006

Related U.S. Application Data

(62) Division of application No. 10/721,165, filed on Nov. 26, 2003, now Pat. No. 7,333,267.

(51) Int. Cl.
*B29D 11/00* (2006.01)
(52) U.S. Cl. .......................................... 216/26
(58) Field of Classification Search ................... 216/26; 430/321; 359/619, 620
See application file for complete search history.

(56) References Cited

U.S. PATENT DOCUMENTS

| 5,479,049 A | 12/1995 | Aoki et al. |
| 5,764,319 A | 6/1998 | Nishihara |
| 5,790,730 A | 8/1998 | Kravitz et al. |
| 5,815,229 A | 9/1998 | Shapiro |
| 6,469,832 B2 * | 10/2002 | Yotsuya et al. ............... 359/619 |
| 6,781,762 B2 | 8/2004 | Ozawa |
| 6,821,810 B1 | 11/2004 | Hsiao et al. |
| 7,042,527 B2 | 5/2006 | Imai et al. |

FOREIGN PATENT DOCUMENTS

| JP | 05150103 A | * | 6/1993 |
| JP | 09116127 A | * | 5/1997 |
| JP | 2001239532 A | * | 9/2001 |

OTHER PUBLICATIONS

Wolf, e al. "Silicon Processing for the VLSI Era" vol. 1, pp. 407-408. Lattice Press 1986.*
U.S. Appl. No. 10/713,188, Li.
U.S. Appl. No. 10/667,390, Tongbi Jiang et al.

* cited by examiner

*Primary Examiner*—Roberts Culbert
(74) *Attorney, Agent, or Firm*—Dickstein Shapiro LLP

(57) ABSTRACT

A micro-lens and a method for forming the micro-lens is provided. A micro-lens includes a substrate and lens material located within the substrate, the substrate having a recessed area serving as a mold for the lens material. The recessed can be shaped such that the lens material corrects for optical aberrations. The micro-lens can be part of a micro-lens array. The recessed area can serve as a mold for lens material for the micro-lens array and can be shaped such that the micro-lens array includes arcuate, non-spherical, or non-symmetrical micro-lenses.

19 Claims, 7 Drawing Sheets

MICRO-LENSES FOR CMOS IMAGERS AND METHOD FOR MANUFACTURING MICRO-LENSES

The present application is a divisional of Ser. No. 10/721,165 which was filed on Nov. 26, 2003, the entire disclosure of which is incorporated herein by reference.

FIELD OF THE INVENTION

The present invention relates generally to the field of semiconductor devices and more particularly, to micro-lenses utilized in imager devices or displays.

BACKGROUND

The semiconductor industry currently uses different types of semiconductor-based imagers, such as charge coupled devices (CCDs), CMOS active pixel sensors (APS), photodiode arrays, charge injection devices and hybrid focal plane arrays, among others, that use micro-lenses. Semiconductor-based displays using micro-lenses are also known.

It is desirable to maximize the amount of light received by the photo-conversion devices of an imager. One way to increase the light received by the photo-conversion devices is to increase the amount of light received by micro-lenses, which collect external light and focus it on the photo-conversion device. Another way is to enhance the positioning of the focal point of each micro-lens to ensure that much of the light received by the micro-lenses is focused on the photo-conversion devices.

Micro-lenses may be formed through an additive process in which a lens material is formed on a substrate and subsequently is formed into a micro-lens shape. Micro-lenses also may be formed by a subtractive process in a substrate. Known subtractive processes are complex and manufacturing micro-lenses from such known processes is difficult.

SUMMARY

The present invention provides an easily manufactured micro-lens which can be used in an imager or display device. In one exemplary embodiment, the micro-lens includes a substrate and lens material located within the substrate, the substrate having an opening serving as a mold for the lens material. The opening can be shaped such that the lens material corrects for optical aberrations.

In an exemplary embodiment of an imager, the imager includes a plurality of pixel cells each having a photo-conversion device, a mask for directing electromagnetic radiation to each photo-conversion device, a color filter assembly, and a micro-lens array including a plurality of micro-lenses each associated with one of the pixel cells. The micro-lens array includes a recessed area in a substrate serving as a mold for lens material. The micro-lens array can be configured to effect a change in focal point between the micro-lenses to correct for optical aberrations and/or for the wavelength dependency of the photo-conversion devices for each of the colors detected.

In an exemplary micro-lens system embodiment, a micro-lens system is provided that includes a first micro-lens array including a first plurality of micro-lenses and a second micro-lens array including a second plurality of micro-lenses. The first micro-lens array is positioned over the second micro-lens array.

In an exemplary fabrication embodiment, a method is provided for manufacturing a micro-lens array. The method includes the acts of forming a recessed area in a substrate, wherein the recessed area includes a plurality of micro-lens sections having different profiles, and filling the recessed area with a lens material to form a plurality of micro-lenses.

These and other features of the invention will be more readily understood from the following detailed description of the invention, which is provided in connection with the accompanying drawings.

DETAILED DESCRIPTION OF PREFERRED EMBODIMENTS

Figure 1:
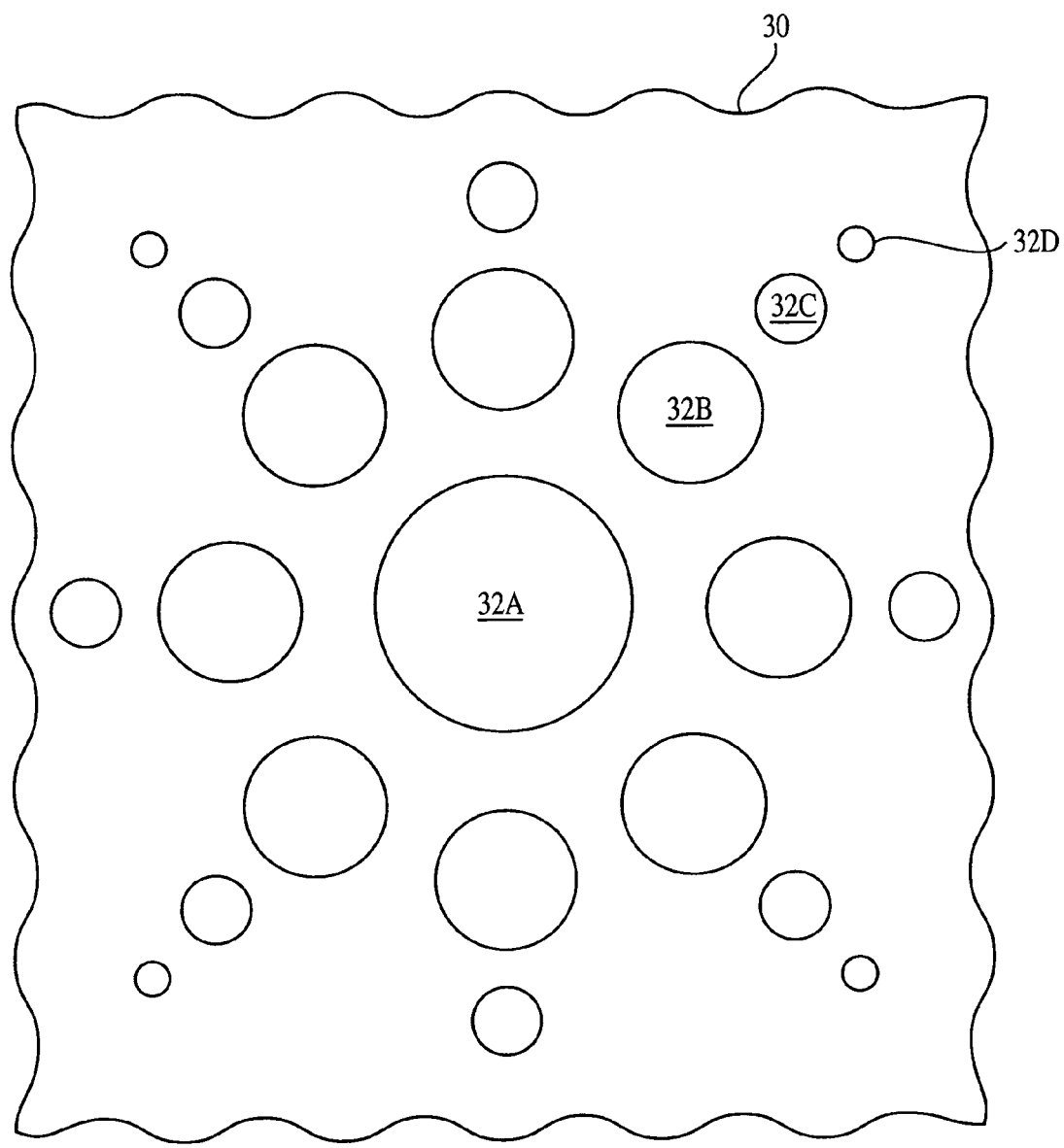
FIG. 1 is a plan view of a portion of a lithographic mask constructed in accordance with an exemplary embodiment of the invention.
Figure 2A:
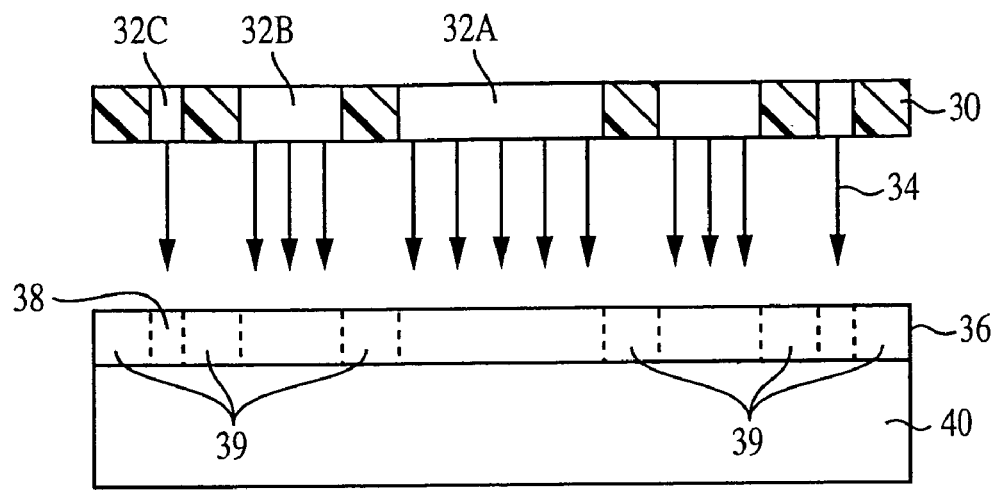
FIGS. 2A-2F are cross-sectional views illustrating formation of a micro-lens using the lithographic mask of FIG. 1.

FIGS. 1 and 2A illustrate a portion of a lithographic mask 30 used in forming a first exemplary embodiment of a micro-lens array. The lithographic mask 30 as shown includes a variety of openings $32_{A-D}$. The openings $32_{A-D}$ are shown to be circular in shape, although it should be understood that the openings $32_{A-D}$ may take any symmetrical or non-symmetrical shape. The openings $32_{A-D}$ are further illustrated as being in a pattern whereby the largest opening $32_A$ is immediately surrounded by the next largest openings $32_B$, with the smaller openings $32_C$ and $32_D$ being positioned peripheral to the openings $32_B$. The illustrated lithographic mask 30 is suitable for manufacturing a plurality of micro-lenses at a time. The lithographic mask 30 may further include many similar patterns for the formation of a greater number of micro-lenses.

With specific reference to FIGS. 2A-2G and 3, next will be described a process for forming a first micro-lens array embodiment. An objective is to form, through controllable design and processing, a plurality of micro-lenses whose focal points change gradually across the micro-lens array. The process generally includes a subtractive step followed by an additive step, another subtractive step, and an optional out gassing step.

At Step 100 (FIG. 3), a photo resist layer 36 is formed on a substrate 40. The substrate 40 is an insulating layer of an imager pixel array which is above a semiconductor substrate on which the pixel array is formed. Preferably, the substrate 40 may be formed of any well known transparent insulator material, for example, $SiO_2$, among many others.

As illustrated (FIGS. 2A, 2B), the photo resist material forming the photo resist layer 36 is a positive resist. Nonetheless, the photo resist material forming the photo resist layer 36 may be a negative resist. If the photo resist layer 36 is formed of a negative resist material, the lithographic mask would have to be inverted from the lithographic mask 30 illustrated in FIGS. 1 and 2A.

Figure 2B:
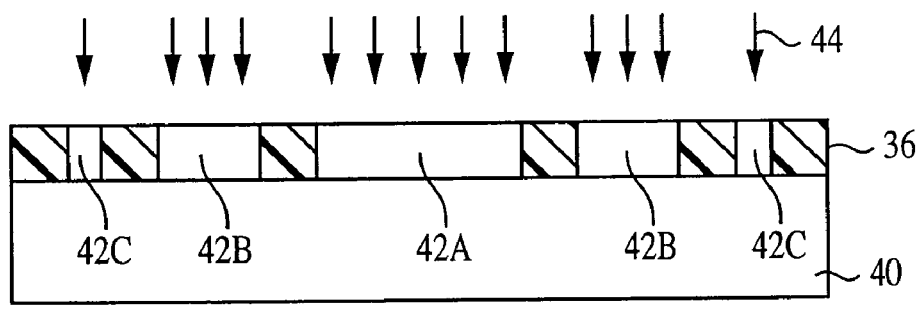

Next, at Step 105, electromagnetic radiation, such as light 34, is directed through the lithographic mask 30 to image the photo resist layer 36 and expose first portions 38, leaving second portions 39 unexposed. Following Step 105, at Step 110 portions of the photo resist layer 36 are removed using a suitable resist developer, such as, for example, dilute TMAH. The photo resist layer 36 illustrated in FIGS. 2A and 2B is a positive resist, and so the first portions 38 are those portions imaged by the electromagnetic radiation 34 at Step 105 and subsequently removed at Step 110 to form openings $42_{A-C}$. It should be appreciated, however, that for a photo resist layer 36 that is a negative resist, a lithographic mask inverse to the lithographic mask 30 would be required and the electromagnetic radiation 34 would image the second portions 39 at Step 105, and the unexposed first portions 38 of the photo resist layer 36 would be removed at Step 110.

Figure 2C:
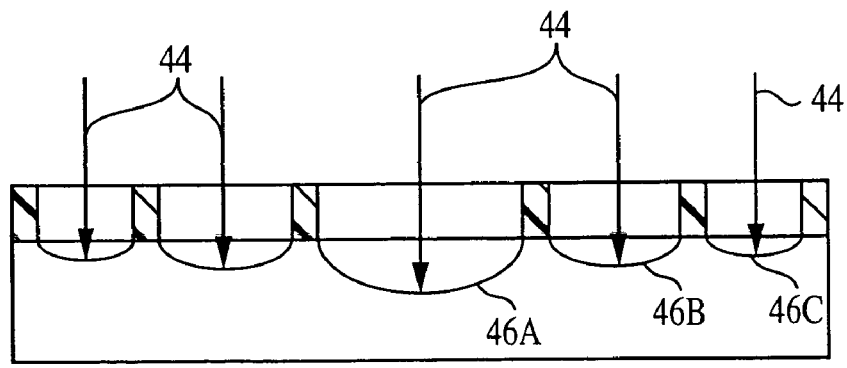
Figure 2D:
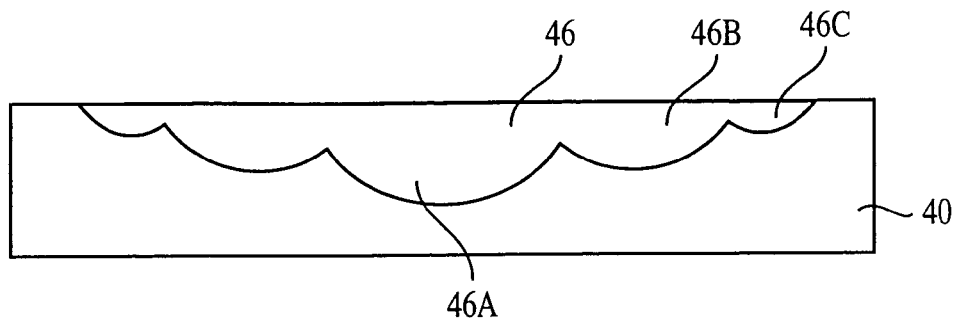
Figure 2E:
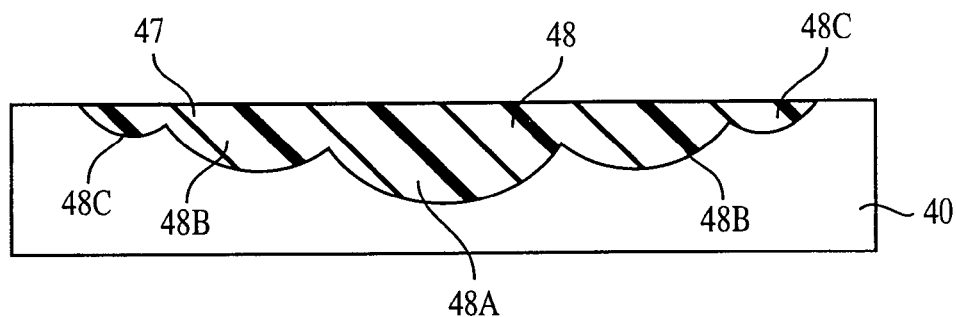

The remainder of the photo resist layer 36 is then used as an etch mask. Specifically, at Step 115, the substrate 40 is etched through the etch mask (remainder of photo resist layer 36) to form a recessed area 46 (FIG. 2D). Etching material 44, which is at least partially if not fully isotropic, is placed within the openings $42_{A-C}$ and allowed to etch through both the photo resist layer 36 and the substrate 40 (FIG. 2C). The etching material 44 may be a dry etching material, a wet etching material, or a combination of wet and dry etching materials. As illustrated in FIGS. 2C and 2D, during the etching process, holes $46_{A-C}$ are formed in the substrate 40, and due to the isotropic nature of the etching material and the crystalline orientation of the substrate 40, the holes $46_{A-C}$ grow in size and depth and eventually combine to form the recessed area 46, which is then used as a mold for the micro-lens array. The targeted shape of the recessed area 46 includes a smooth surface which is obtained by a controlled merging of the neighboring holes $46_{A-C}$. The holes $46_{A-C}$ are sized and positioned in such a way to, along with the underetch properties of the etching material 44, determine the shape of the mold for the micro-lens array.

As illustrated in FIGS. 2C-2F, the etching material 44 in the openings $42_{A-C}$ etches the substrate 40 to assist in the formation of the holes $46_{A-C}$, which grow to form micro-lens molds $46_{A-C}$. Specifically, the hole $46_A$ grows to become the micro-lens mold $46_A$ of the recessed area 46. In likewise fashion, the etching material 44 in the openings $42_B$ etches the substrate 40 to combine all the holes $46_B$ together and to create the micro-lens molds $46_B$, and the etching material 44 deposited in the openings $42_C$ etches the substrate 40 to enlarge all the holes $46_C$ to create the micro-lens molds $46_C$. Although the micro-lens molds $46_{A-C}$ are shown to have arcuate portions, it should be appreciated that one or more of the micro-lens molds $46_{A-C}$ may instead have non-spherical and even non-symmetrical aspects. Further, it should be appreciated that more or less than three micro-lens molds may be formed, depending upon the number of openings in the photo resist layer 36.

Next, at step 120, the remainder of the photo resist layer 36 is removed and the micro-lens array mold 46 for the micro-lens array is filled to form an array of micro-lenses 48 having micro-lenses $48_{A-C}$. Preferably, the micro-lens array mold 46 is filled with a lens material 47 (FIG. 2E) having a different refractive index than the refractive index of the substrate 40, which, as noted, may be formed of silicon dioxide. If forming a positive micro-lens, the refractive index of the lens material 47 is greater than the refractive index of the substrate 40, and hence the micro-lenses thus formed are focusing lenses causing light rays to converge. One preferred positive micro-lens includes a silicon nitride lens material 47 in a silicon dioxide substrate 40. If forming a negative micro-lens, the refractive index of the lens material 47 is less than the refractive index of the substrate 40, and hence, the micro-lenses thus formed cause light rays to diverge. One preferred negative micro-lens includes a low refractive index polymer, most preferably a transparent photosensitive polymer, lens material 47 in a silicon dioxide substrate 40.

With specific reference to FIGS. 2D-2G, the micro-lens molds $46_{A-C}$ are filled with the lens material 47, to form a first micro-lens $48_A$ surrounded by second micro-lenses $48_B$ and third micro-lenses $48_C$. The illustrated first micro-lens $48_A$ has a generally circular profile. The surrounding second micro-lenses $48_B$ each includes an arcuate portion and they completely surround the first micro-lens $48_A$. The illustrated third micro-lenses $48_C$ each includes an arcuate lens portion separated from one another. Each of the third micro-lenses $48_C$ combines with a second micro-lens $48_B$. It should be appreciated that the mask 30 can be so configured to produce the third micro-lenses $48_C$ in such a way that they instead combine together like the second micro-lenses $48_B$. Once the micro-lens array mold 46 has been filled with the lens material 47, at Step 125 the lens material 47 is planarized by, for example, chemical-mechanical planarization, to render it flush with the surface of the substrate 40.

Figure 2F:
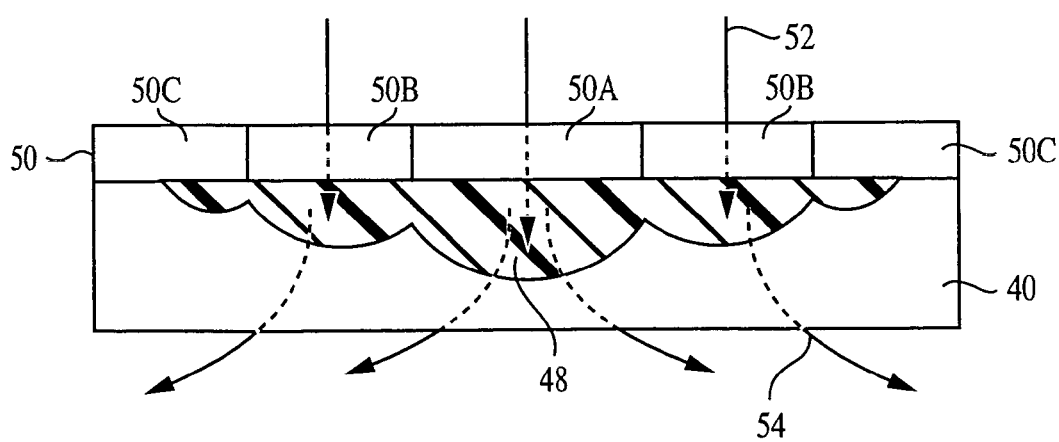
Figure 2G:
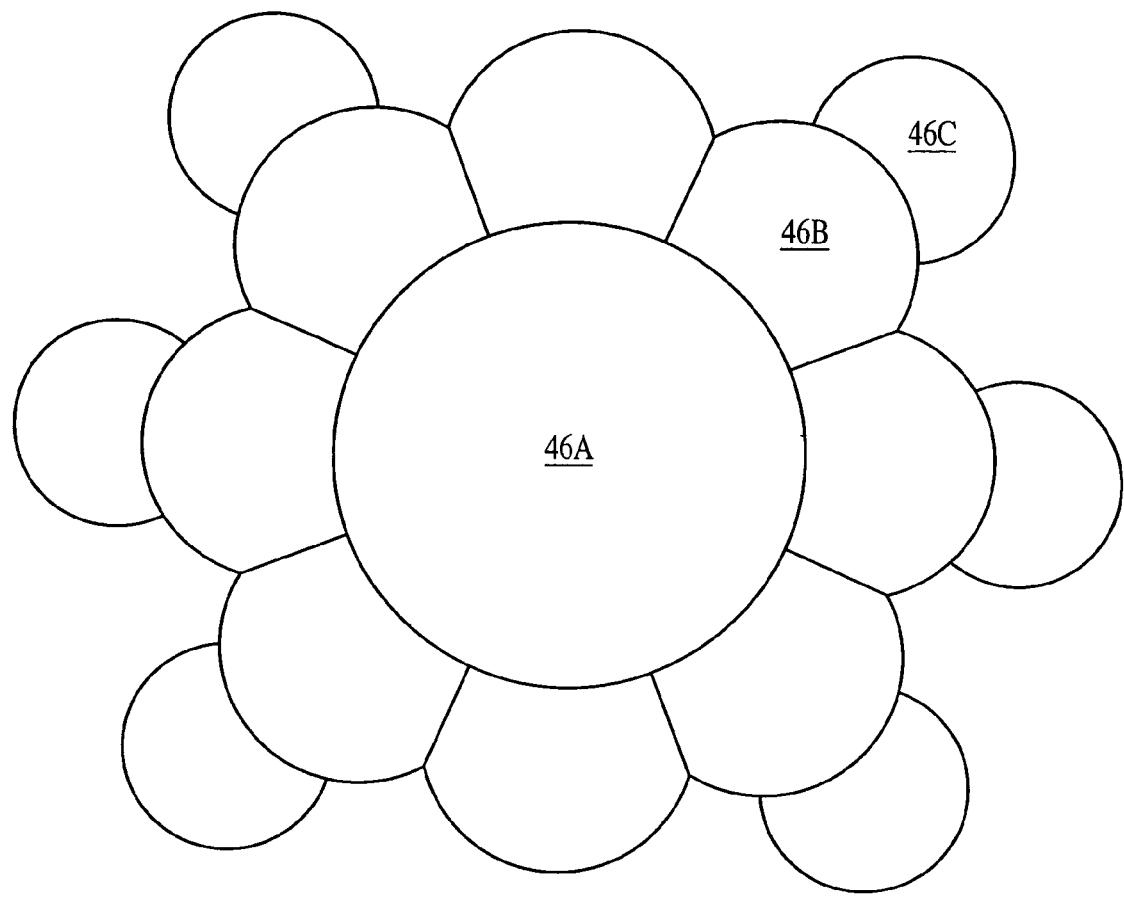
FIG. 2G is a top view illustrating the lens mold shown in FIG. 2D.

As illustrated in FIG. 2F, a color filter array 50 including color filters $50_{A-C}$ is then formed over the micro-lenses 48 thus made at Step 130 so that each pixel cell has one associated color filter of, for example, red, green or blue filters. If the lens material 47 used to form the micro-lenses 48 is a special heat-decomposable polymer, at Step 135 heat 52 can be applied to the micro-lenses 48 to cause thermal decomposition, or outgassing, 54 to leave only residual gas in the micro-lenses 48. To facilitate outgassing, suitable small openings can be provided in the color filter array.

Figure 3:
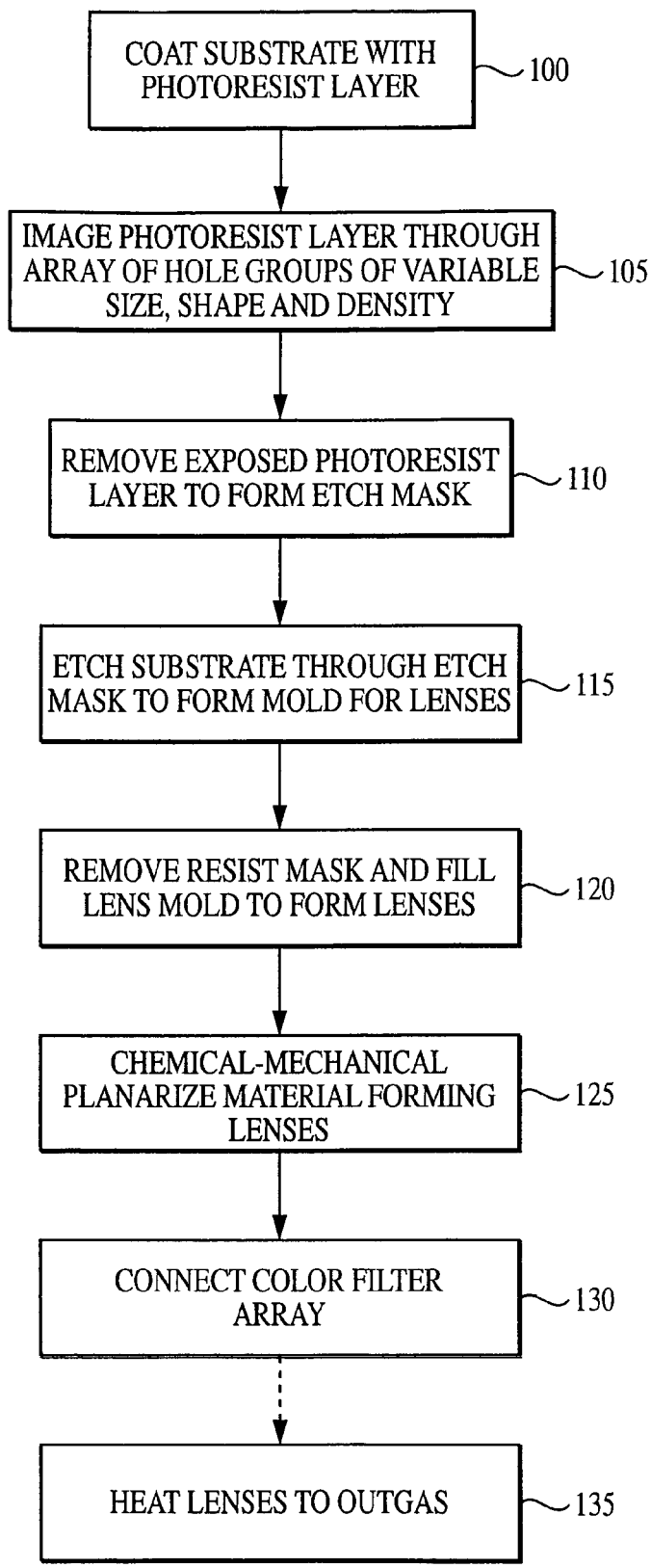
FIG. 3 illustrates a process for forming a micro-lens using the lithographic mask of FIG. 1.
Figure 4:
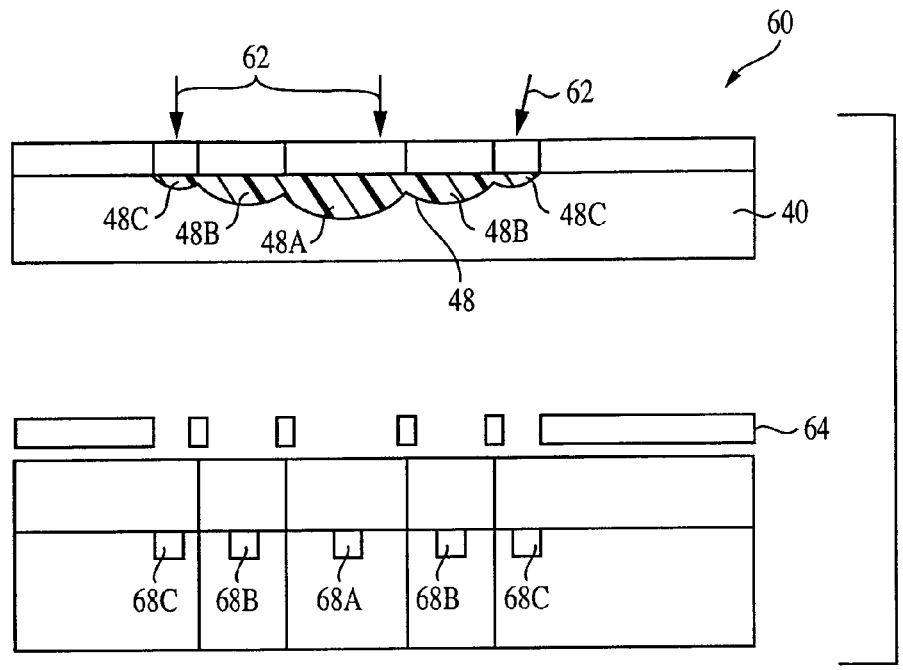
FIG. 4 is an exploded view of an imager with a micro-lens formed from the lithographic mask of FIG. 1.

Referring to FIG. 4, there is shown a portion of an imager 60, for example, a CMOS imager, that may incorporate the micro-lens array 48, including the micro-lenses $48_{A-C}$ formed through the process described with reference to FIGS. 1-3. It should be appreciated that other semiconductor-based imagers, as well as semiconductor-based displays, may also incorporate the micro-lens array 48. The illustrated CMOS imager 60 includes a light shield 64 and a plurality of pixel cells, each with a respective photosensor $68_{A-C}$, which may be a photo-conversion device such as a photodiode or photogate. The CMOS imager 60, which includes the micro-lens array 48 formed in the substrate 40, also includes a color filter array 50 including a variety of color filters, one for each micro-lens $48_{A-C}$ and corresponding pixel cell and photosensor $68_{A-C}$. Electromagnetic radiation, such as light 62, is directed through the micro-lens array 48, and each micro-lens $48_{A-C}$ focuses the light 62 on respective one of the photosensors $68_{A-C}$. The light shield 64 is configured to inhibit cross talk between the illustrated pixel cells. The micro-lens array 48 effects a change in the focal point between the individual micro-lenses to correct for optical aberrations in the imager module or pixel asymmetries, for example, those due to specific space saving imager designs.

Figure 5:
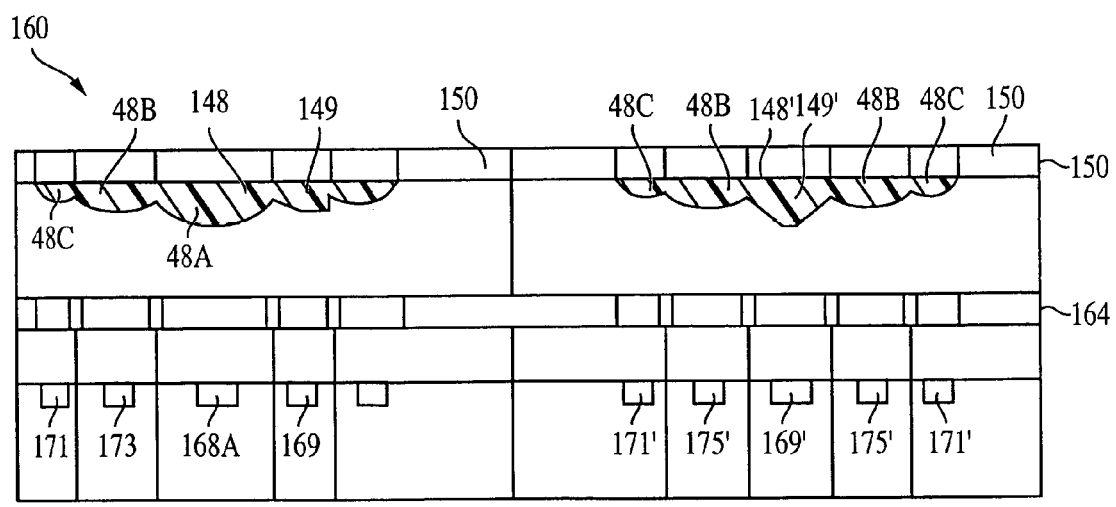
FIG. 5 is a view of an imager formed in accordance with another exemplary embodiment of the invention.

FIG. 5 illustrates a portion of an imager 160, e.g., a CMOS imager, that includes a plurality of pixel cells. Each pixel cell includes a respective photosensor, such as the illustrated photosensors 168A, 169, 169', 171, 171', 173, and 175'. Again, as with the light shield 64 (FIG. 4), a light shield 164 is positioned and configured to suppress cross talk between the illustrated pixel cells. The illustrated imager 160 includes a color filter array 150. A micro-lens array 148 is included with a non-symmetrical micro-lens 149 and more symmetrical micro-lenses $48_A$, $48_B$, and $48_C$, whereas a micro-lens array 148' is included with a non-spherical micro-lens 149' and more symmetrical micro-lenses $48_A$ and $48_B$. It should be appreciated that a matrix of micro-lens arrays, such as the arrays 48, 148, and 148' can be formed adjacent to one another. Although the light shields 64, 164 are illustrated as part of the imager 60, 160, it should be appreciated that the light shields 64, 164 are optional and may not be required in certain circumstances.

By forming micro-lenses through the above-described subtractive method, individual micro-lens structures can be formed for each type of color pixel cells to take advantage of the different absorption depths of light in the substrate 40 due to the different wavelengths of light which pass through the various filters. The focal point of each micro-lens is wavelength dependent. For example, light through a blue filter absorbs at the surface of a silicon substrate and thus requires a short focal length, while light through a red filter absorbs several microns into the silicon substrate and thus requires a longer focal length. Thus, forming micro-lenses with structural differences depending on the wavelength of light to be detected by a pixel cell enhances the light received at each photosensor by controlling the position of the focal point for each micro-lens.

Further, if a photosensor is not centered within its respective pixel cell, then the focal point of the micro-lens would be shifted along the X-Y plane. The use of non-symmetrical lens sections, such as the non-symmetrical lens section 149 adjusts the focal point. Additionally, if the imager 160 is positioned so close to a primary imaging lens, for example, a camera lens, that the size of the imager is comparable to the distance between the camera lens and the imager, the incident angle of light on each pixel cell changes significantly across the imager. This results in signal intensity and color changes across the image, as well as added pixel cell cross talk. By providing micro-lenses with changing shapes for respective lens sections, the effects caused by the close proximity of the imager to the camera lens can be compensated for.

Figure 6:
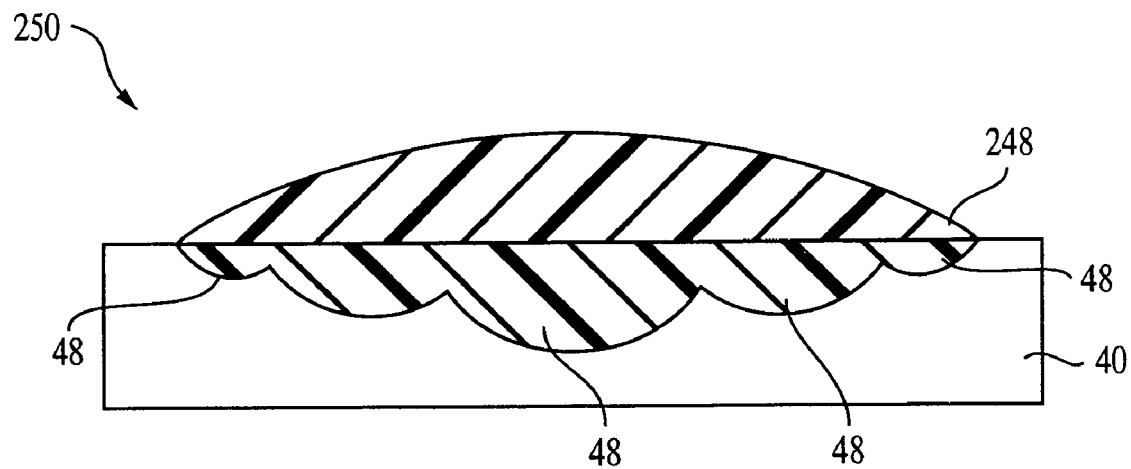
FIG. 6 is a cross-sectional view of a micro-lens system formed in accordance with another exemplary embodiment of the invention.
Figure 7:
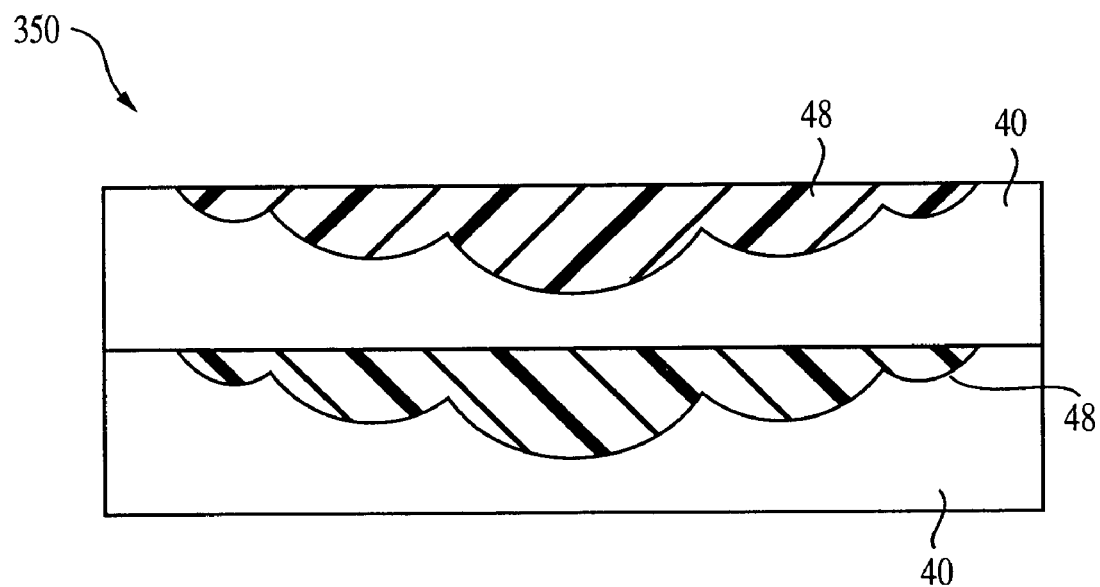
FIG. 7 is a cross-sectional view of an alternative micro-lens system.

Micro-lenses according to embodiments of the invention described above in connection with FIGS. 1-5 can be implemented in a lens system. A lens system can include a series of lenses that function together. FIGS. 6 and 7 illustrate exemplary embodiments of lens systems according to the invention. As shown in FIG. 6, a lens system 250 includes a micro-lens array 48, which in turn includes the micro-lenses $48_{A-C}$. Positioned over the micro-lens array 48 is a micro-lens array 248 formed in an additive process. The micro-lens array 248 includes spherical micro-lenses and can be formed by techniques known in the art.

FIG. 7 depicts another embodiment of a lens system according to the invention. In the lens system 350, includes micro-lens arrays 48 and 48', both of which are formed through the subtractive process described above in connection with FIGS. 1-5. Specifically, each of the micro-lens arrays 48', 48 are formed in a substrate 40 and layer 41, respectively. After a first micro-lens array 48' is formed in substrate 40, a second layer 41 of a suitable material, for example, a same material as substrate 40, e.g. $SiO_2$, is deposited over substrate 40 and first micro-lens array 48'. Then, a second micro-lens array 48 is formed in layer 41 by the same methods used to form micro-lens array 48'.

The lens systems 250, 350 are advantageous in that they allow for additional control to be exerted over chromatic properties. Chromatic aberrations can be alleviated at least to some extent with the lens systems 250, 350. The micro-lens arrays in the lens systems 250, 350 may have differing refractive indexes and/or different lens shapes to assist in correcting chromatic aberrations.

While the invention has been described in detail in connection with exemplary embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A method for manufacturing a micro-lens array, comprising:
    etching a substrate to form a plurality of holes, each of the plurality of holes being formed in a respective section of the substrate and having a respective surface profile in the substrate;
    growing the plurality of holes such that they combine to form a recessed area in the substrate; and
    filling the formed recessed area with a lens material to form a plurality of micro-lenses.

2. The method of claim 1, wherein said act of filling the recessed area comprises filling the recessed area with a lens material exhibiting a refractive index different than the refractive index of the substrate.

3. The method of claim 1, further comprising, prior to the etching step, forming a layer of photo resist material, the act of forming the layer of photo resist material comprising coating a layer of photo resist material on the substrate.

4. The method of claim 3, further comprising, subsequent to forming the layer of photo resist material, exposing portions of the layer of photo resist material, and removing exposed portions of the layer of photo resist material.

5. The method of claim 3, further comprising, subsequent to forming the layer of photo resist material, exposing portions of the layer of photo resist material, and removing unexposed portions of the layer of photo resist material.

6. The method of claim 1, wherein the act of filling comprises filling the recessed area with a lens material exhibiting a refractive index greater than the refractive index of the substrate.

7. The method of claim 1, wherein the act of filling comprises filling the recessed area with a lens material exhibiting a refractive index less than the refractive index of the substrate.

8. The method of claim 7, wherein the act of filling comprises filling the recessed area with a lens material comprising a polymer.

9. The method of claim 8, further comprising heating the lens material to promote thermal decomposition of the polymer.

10. The method of claim 1, further comprising connecting a color filter assembly to the substrate.

11. A method for manufacturing a micro-lens array, comprising:
    forming a layer of photo resist material on a substrate;
    imaging the layer of photo resist material through a mask having a plurality of differently sized openings;
    removing portions of the layer of photo resist material to expose portions of the substrate;
    etching the exposed portions of the substrate to form respective holes formed in respective sections formed across the substrate, wherein at least one of the respective holes has a different surface profile in the substrate than at least a second of the respective holes and growing the holes in size such that they combine to form a recessed area; and filling the recessed area with a lens material to form a plurality of micro-lenses.

12. The method of claim 11, wherein the act of etching comprises wet etching.

13. The method of claim 11, wherein the act of etching comprises dry etching.

14. The method of claim 11, wherein the act of etching comprises a combination of wet etching and dry etching.

15. The method of claim 11, wherein said act of filling the recessed area comprises filling the recessed area with a lens material exhibiting a refractive index different than the refractive index of the substrate.

16. A method for forming a micro-lens structure comprising:

forming at least a first recessed hole and a second recessed hole in a substrate, the first recessed hole having a first surface profile in the substrate and the second recessed hole having a second surface profile in the substrate;

growing the first and second recessed holes such that they combine to form a single recessed hole in the substrate; and filling the single recessed hole with a lens material to form at least a portion of a micro-lens array.

17. The method of claim 16, wherein said act of filling the single recessed hole comprises filling the recessed hole with a lens material having a refractive index that is different than the refractive index of the substrate.

18. The method of claim 16, wherein said act of forming at least a first recessed hole and a second recessed hole comprises etching the substrate to form the first recessed hole and the second recessed hole in the substrate.

19. The method of claim 16, further comprising the step of forming a color filter array above the formed micro-lens array.

* * * * *